United States Patent
Ichiyama

(10) Patent No.: US 11,005,463 B2
(45) Date of Patent: May 11, 2021

(54) SIGNAL PROCESSOR AND SIGNAL PROCESSING METHOD

(71) Applicant: ADVANTEST CORPORATION, Tokyo (JP)

(72) Inventor: Kiyotaka Ichiyama, Saitama (JP)

(73) Assignee: ADVANTEST CORPORATION, Tokyo (JP)

(*) Notice: Subject to any disclaimer, the term of this patent is extended or adjusted under 35 U.S.C. 154(b) by 0 days.

(21) Appl. No.: 16/876,152

(22) Filed: May 18, 2020

(65) Prior Publication Data

US 2020/0412350 A1 Dec. 31, 2020

(30) Foreign Application Priority Data

Jun. 28, 2019 (JP) .............................. JP2019-121980

(51) Int. Cl.
*H03K 5/135* (2006.01)
*H03K 5/00* (2006.01)

(52) U.S. Cl.
CPC ... *H03K 5/135* (2013.01); *H03K 2005/00019* (2013.01)

(58) Field of Classification Search
None
See application file for complete search history.

(56) References Cited

U.S. PATENT DOCUMENTS

| | | | | |
|---|---|---|---|---|
| 5,675,335 A * | 10/1997 | Keller | ................. | H03M 1/0614 341/131 |
| 6,144,242 A * | 11/2000 | Jeong | .................... | H04L 25/085 327/269 |
| 6,600,771 B1 * | 7/2003 | Moon | ........................ | G06F 1/04 327/269 |
| 6,654,897 B1 * | 11/2003 | Dreps | ................. | G06F 13/4208 713/401 |
| 7,656,214 B1 * | 2/2010 | Han | ........................ | H03K 7/06 327/291 |
| 8,269,537 B2 * | 9/2012 | Bae | ....................... | H03K 5/1565 327/161 |
| 9,397,647 B2 * | 7/2016 | Romano | ................. | H03K 5/133 |
| 9,755,818 B2 * | 9/2017 | Sengoku | ................. | H04L 7/033 |
| 10,148,261 B1 * | 12/2018 | Jagannathan | ...... | H03K 19/0175 |
| 10,409,322 B2 * | 9/2019 | Liang | ...................... | H03L 7/093 |
| 2005/0057381 A1 * | 3/2005 | Fletcher | ................. | H03B 29/00 341/131 |
| 2008/0304608 A1 | 12/2008 | Ishida | | |
| 2010/0060294 A1 | 3/2010 | Suda | | |
| 2011/0216863 A1 * | 9/2011 | Tomita | ...................... | H04L 7/00 375/371 |

FOREIGN PATENT DOCUMENTS

| | | | |
|---|---|---|---|
| JP | 2005091108 A | | 4/2005 |
| JP | 2007033385 | | 2/2007 |
| WO | 2008149973 A1 | | 12/2008 |

* cited by examiner

*Primary Examiner* — Thomas J. Hiltunen

(57) ABSTRACT

A signal processor is provided, comprising a data variable delay circuit that delays data signals, a clock variable delay circuit that delays a clock signal indicating timing to acquire the data signals, a jitter signal supplying unit that supplies, to the data variable delay circuit and the clock variable delay circuit, a jitter signal to change an amount of delay in a same direction, and a re-timing circuit that outputs a jitter-applied data signal obtained by re-timing the data signals delayed by the data variable delay circuit with the clock signal delayed by the clock variable delay circuit.

6 Claims, 5 Drawing Sheets

EYE DIAGRAM (BEFORE JITTER APPLICATION)   EYE DIAGRAM (AFTER JITTER APPLICATION)

SIGNAL PROCESSOR AND SIGNAL PROCESSING METHOD

The contents of the following Japanese patent application(s) are incorporated herein by reference:
NO. 2019-121980 filed in JP on Jun. 28, 2019.

BACKGROUND

1. Technical Field

The present invention relates to a signal processor and a signal processing method.

2. Related Art

Conventionally, a jitter generator that applies jitter to an input signal is known. (See, for example, Patent documents 1 and 2). In addition, a calibration technology that compensates a skew by calculating a skew among a plurality of signals and adjusting the phase based on the calculated skew is known. (See, for example, Patent document 3).

RELATED ART

Patent Documents

[Patent document 1] Japanese Patent Application Publication No. 2007-33385
[Patent document 2] Japanese Patent Application Publication No. 2005-91108
[Patent document 3] International Publication No. WO2008/149973

Preferably, when outputting a jitter-applied signal obtained by re-timing data signals with a clock signal, jitter is applied precisely.

GENERAL DISCLOSURE

To solve the above-mentioned issue, a signal processor is provided in the first aspect of the present invention. The signal processor may include a data variable delay circuit that delays data signals. The signal processor may include a clock variable delay circuit that delays a clock signal indicating a timing to acquire the data signal. The signal processor may include a jitter signal supplying unit that supplies, to the data variable delay circuit and the clock variable delay circuit, a jitter signal to change the amount of delay in a same direction. The signal processor may include a re-timing circuit that outputs a jitter-applied data signal obtained by re-timing the data signals delayed by the data variable delay circuit with the clock signal delayed by the clock variable delay circuit.

The data variable delay circuit may have a plurality of data variable delay blocks that delays each of a plurality of the data signals, the jitter signal supplying unit may supply the jitter signal to each of the plurality of data variable delay blocks, and the re-timing circuit may output a jitter-applied data signal obtained by re-timing the plurality of data signals delayed by the plurality of data variable delay blocks with the clock signal delayed by the clock variable delay circuit.

The re-timing circuit may output a signal encoded based on logical values of the plurality of data signals in at least one line outputting the jitter-applied data signal.

The encoded signal may be a multi-value modulation signal that is subjected to a multi-value modulation based on logical values of the plurality of data signals.

The clock variable delay circuit may delay the clock signal within a range that satisfies a setup-hold timing of the data signals delayed by the data variable delay circuit.

The data variable delay circuit and the clock variable delay circuit may generate a substantially identical amount of delay for the same jitter signal.

The signal processor may further include a gain adjusting unit that is capable of adjusting gain of each of the jitter signals supplied from the jitter signal supplying unit to the data variable delay circuit and the clock variable delay circuit.

The jitter signal supplying unit may supply at least one of a sinusoidal jitter, a random jitter, and a bounded uncorrelated jitter, as the jitter signal.

In a second aspect of the present invention, a signal processing method is provided. The signal processing method may include supplying, to a data variable delay circuit that delays data signals and a clock variable delay circuit that delays a clock signal indicating timing to acquire the data signals, a jitter signal to change an amount of delay in a same direction. The signal processing method may include outputting a jitter-applied data signal obtained by re-timing the data signals delayed by the data variable delay circuit with the clock signal delayed by the clock variable delay circuit.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the invention according to the claims. In addition, not all combinations of the features described in the embodiments are necessarily essential to the solution of the invention.

Figure 1:
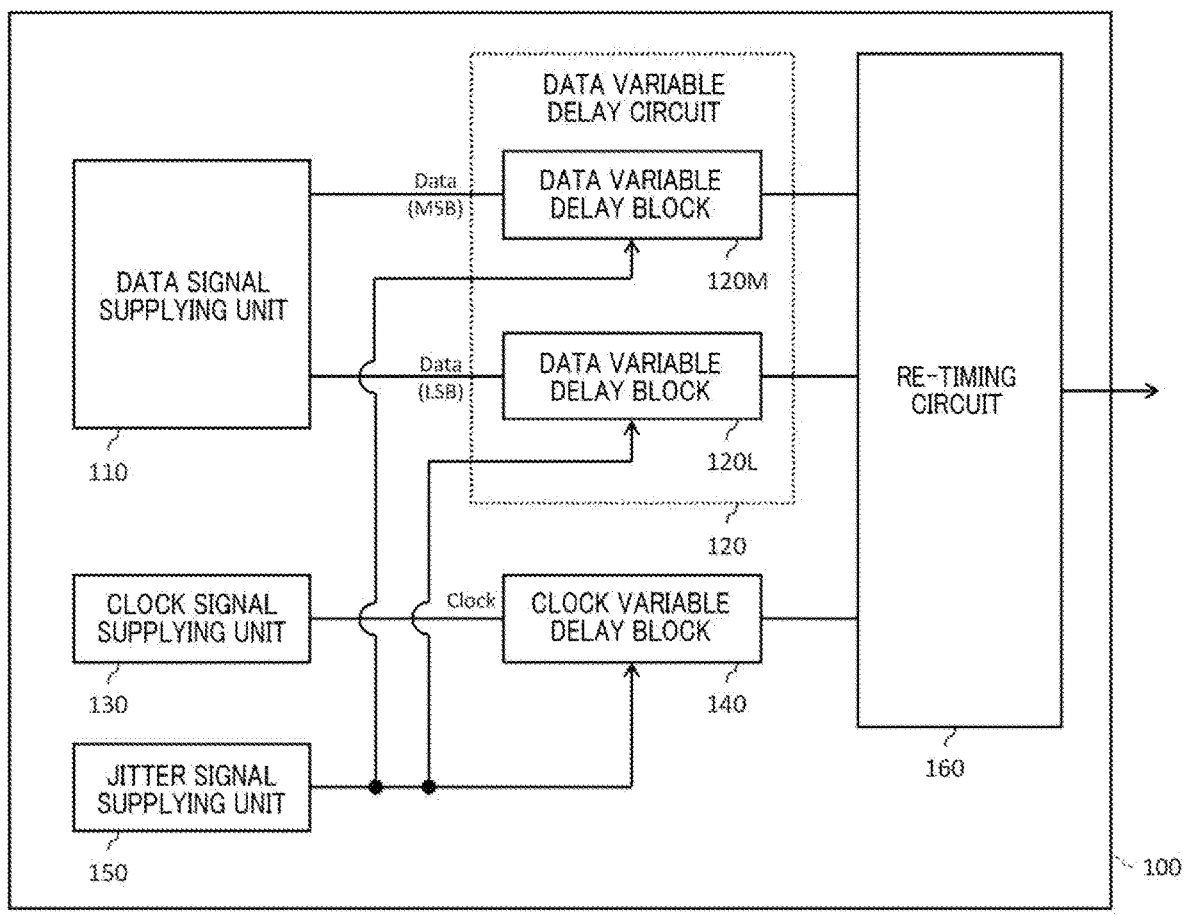
FIG. 1 shows an exemplary block diagram of a signal processor 100 according to the present embodiment.

FIG. 1 shows an exemplary block diagram of a signal processor 100 according to the present embodiment. The signal processor 100 may be, for example, a test signal generator or the like that generates a test signal to test a to-be-tested device, and outputs a jitter-applied signal as the test signal. In such a case, the signal processor 100 according to the present embodiment delays the data signals and the clock signal in the same direction, and outputs a jitter-applied data signal obtained by re-timing the delayed data signals with the delayed clock signal.

The present embodiment is described with an example in which a 4 Level-Pulse Amplitude Modulation (PAM4) encoder is used as the re-timing circuit. Here, a scheme in which a bit sequence formed of "0" and "1" is directly modulated as an NRZ (Non Return to Zero) signal, which is a pulse signal of two voltage levels ("0" and "1" corresponds to low voltage and high voltage, respectively), is known as 2 Level-Pulse Amplitude Modulation (PAM2). On the other hand, PAM4 is a scheme in which, based on two bit sequences formed of "0" and "1", that is, MSB (Most Significant Bit) and LSB (Least Significant Bit), modulation is performed as a multi-value signal of four voltage levels ("00", "01", "10", and "11" correspond to L1 voltage, L2 voltage, L3 voltage, and L4 voltage, respectively). The present embodiment is described with an example in which such a PAM4 encoder is used as the re-timing circuit. However, it is not limited thereto. The signal processor 100 may use a re-timer other than a PAM4 encoder, such as a PAM 8 encoder, a duo-binary encoder, and a D flip-flop, as the re-timing circuit.

The signal processor 100 includes a data signal supplying unit 110, a data variable delay circuit 120, a clock signal supplying unit 130, a clock variable delay circuit 140, a jitter signal supplying unit 150, and a re-timing circuit 160.

The data signal supplying unit 110 supplies data signals to the data variable delay circuit 120. In the present embodiment, as one example, the data signal supplying unit 110 supplies the MSB and LSB to the data variable delay circuit 120 as the data signals.

The data variable delay circuit 120 delays the data signals supplied from the data signal supplying unit 110. That is, the data variable delay circuit 120 provides the data signals supplied from the data signal supplying unit 110 with an amount of delay in accordance with the jitter signal described below. Note that, the data variable delay circuit 120 may be any delay circuit capable of delaying an input signal, and may be an analog delay circuit or a digital delay circuit. In addition, the data variable delay circuit 120 may, for example, delay the edge of a signal itself, or may delay a signal by dulling the rising and trailing of the signal. The data variable delay circuit 120 supplies the delayed data signals to the re-timing circuit 160. Here, the data variable delay circuit 120 may have a plurality of data variable delay blocks that each delays a plurality of data signals. In the present embodiment, as one example, the data variable delay circuit 120 has a data variable delay block 120M that delays the MSB and a data variable delay block 120L that delays the LSB. The data variable delay blocks 120M and 120L delays the MSB and LSB, respectively, and supplies the respective delayed MSB and LSB to the re-timing circuit 160.

The clock signal supplying unit 130 supplies, to the clock variable delay circuit 140, a clock signal indicating timing to acquire the data signals.

The clock variable delay circuit 140 delays the clock signal indicating timing to acquire the data signals. The clock variable delay circuit 140 has the same configuration as the data variable delay circuit 120, for example, and provides the clock signal supplied from the clock signal supplying unit 130 with an amount of delay in accordance with the jitter signal described below. The clock variable delay circuit 140 supplies the delayed clock signal to the re-timing circuit 160.

The jitter signal supplying unit 150 supplies, to the data variable delay circuit 120 and the clock variable delay circuit 140, a jitter signal to change the amount of delay in the same direction. In the present embodiment, as one example, the jitter signal supplying unit 150 supplies a jitter signal to each of the data variable delay blocks 120M, 120L, and the clock variable delay circuit 140.

The re-timing circuit 160 outputs a jitter-applied data signal obtained by re-timing the data signals delayed by the data variable delay circuit 120 with the clock signal delayed by the clock variable delay circuit 140. In the present embodiment, as one example, the re-timing circuit 160 outputs a jitter-applied data signal obtained by re-timing the MSB and LSB each delayed by the data variable delay blocks 120M and 120L with the clock signal delayed by the clock variable delay circuit 140, as an output of the signal processor 100. A situation in which the signal processor 100 outputs a jitter-applied data signal will be described in detail using a specific procedure.

Figure 2:
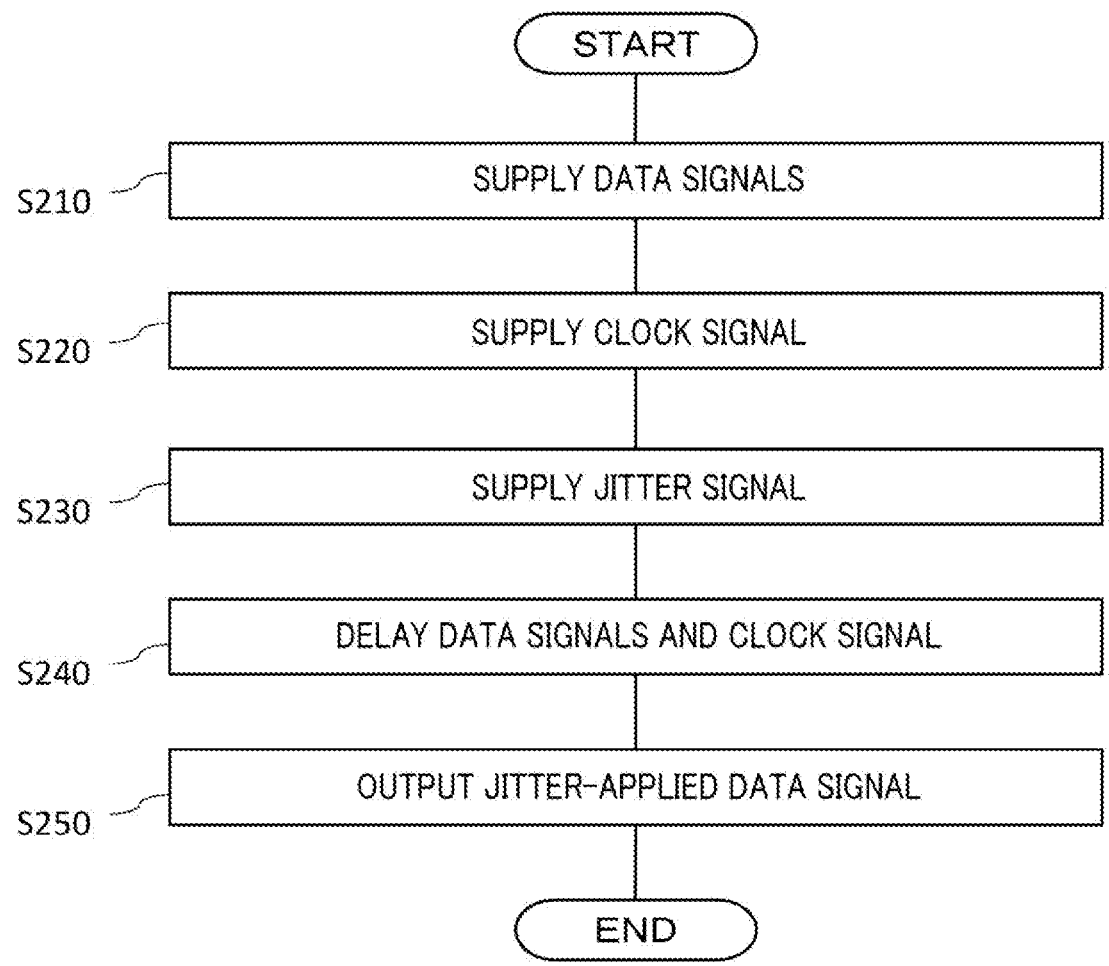
FIG. 2 shows an exemplary procedure of outputting a jitter-applied data signal by the signal processor 100 according to the present embodiment.

FIG. 2 shows an exemplary procedure of outputting a jitter-applied data signal by the signal processor 100 according to the present embodiment. In step 210, the data signal supplying unit 110 supplies data signals to the data variable delay circuit 120. At this time, the data signal supplying unit 110 itself may generate the data signals, or it may acquire the data signals from another apparatus or another functional part, such as an existing pulse pattern generator, for example. In the present embodiment, the data signal supplying unit 110 supplies the MSB and LSB to the data variable delay circuit 120 as the data signals.

In step 220, the clock signal supplying unit 130 supplies, to the clock variable delay circuit 140, a clock signal indicating timing to acquire the data signals. At this time, as with the data signal supplying unit 110, the clock signal supplying unit 130 itself may generate the clock signal, or it may acquire the clock signal from another apparatus or another functional part, such as an existing pulse pattern generator, for example. Note that, step 210 and step 220 may occur at substantially same timing.

In step 230, the jitter signal supplying unit 150 supplies, to the data variable delay circuit 120 and the clock variable delay circuit 140, a jitter signal to change the amount of delay in the same direction. At this time, the jitter signal supplying unit 150 itself may generate the jitter signal, or it may acquire the jitter signal from another apparatus or another functional part, such as an existing jitter generator, for example. When the data variable delay circuit 120 has a plurality of data variable delay blocks, the jitter signal supplying unit 150 may supply a jitter signal to each of the plurality of data variable delay blocks. In the present embodiment, the jitter signal supplying unit 150 supplies a jitter signal to each of the data variable delay blocks 120M, 120L, and the clock variable delay circuit 140. In addition, at this time, the jitter signal supplying unit 150 may supply at least one of a sinusoidal jitter, a random jitter, and a bounded uncorrelated jitter, as the jitter signal.

In step 240, the data variable delay circuit 120 delays the data signals. That is, the data variable delay circuit 120 provides the data signals supplied in step 210 with an amount of delay in accordance with the jitter signal supplied in step 230. In the present embodiment, the data variable delay blocks 120M and 120L provides the MSB and LSB supplied in step 210, respectively, with an amount of delay in accordance with the jitter signal supplied in step 230.

In addition, in step 240, the clock variable delay circuit 140 delays the clock signal indicating the timing to acquire the data signals. That is, the clock variable delay circuit 140 provides the clock signal supplied in step 220 with an amount of delay in accordance with the jitter signal supplied in step 230.

At this time, the clock variable delay circuit 140 delays the clock signal within a range that satisfies a setup-hold timing of the data signals delayed by the data variable delay circuit 120. That is, the clock variable delay circuit 140 delays the clock signal to such timing where the arrival of the data does not violate the setup time and the hold time relative to the clock edge due to a skew between the clock and the data. More preferably, the data variable delay circuit 120 and the clock variable delay circuit 140 may generate a substantially identical amount of delay for the same jitter signal supplied in step 230. In this way, the skew between the data and the clock becomes constant, which makes it possible for the bit transition of the data signal to occur outside of the setup-hold time by means of a jitter. Note that, this may be achieved, for example, by configuring the data variable delay circuit 120 and the clock variable delay circuit 140 with identical variable delay circuits, and supplying the same jitter signal to each of said identical variable delay circuits.

The data variable delay blocks 120M and 120L then supplies the delayed MSB and LSB to the re-timing circuit 160, respectively. In addition, the clock variable delay circuit 140 supplies the delayed clock signal to the re-timing circuit 160.

In step 250, the re-timing circuit 160 outputs a jitter-applied data signal obtained by re-timing the data signals delayed by the data variable delay circuit 120 with the clock signal delayed by the clock variable delay circuit 140. When the data variable delay circuit 120 has a plurality of data variable delay blocks, the re-timing circuit 160 may output a jitter-applied data signal obtained by re-timing a plurality of data signals delayed by the plurality of data variable delay blocks with the clock signal delayed by the clock variable delay circuit 140. In the present embodiment, the re-timing circuit 160 outputs a jitter-applied data signal obtained by re-timing the MSB and the LSB each delayed by the data variable delay blocks 120M and 120L with the clock signal delayed by the clock variable delay circuit 140.

At this time, the re-timing circuit 160 may output a signal encoded based on logical values of the plurality of data signals in at least one line outputting the jitter-applied data signal. For example, when the re-timing circuit 160 is a PAM4 encoder, the encoded signal may be a multi-value modulation signal that is subjected to a multi-value modulation based on logical values of the plurality of data signals. That is, the re-timing circuit 160 may output, as the jitter-applied data signal, a PAM4 signal modulated as a multi-value signal of four voltage levels based on the logical values of the MSB and LSB formed of bit sequences of "0" and "1".

Figure 3:
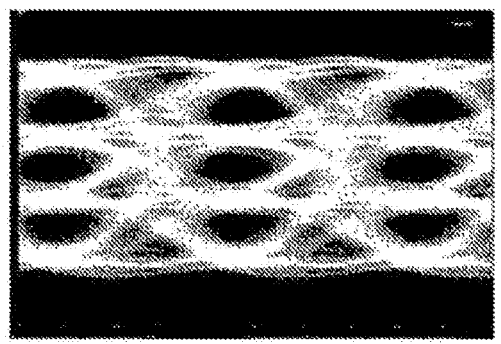
FIG. 3 shows an example of an output signal before and after application of a jitter by the signal processor 100 according to the present embodiment.
Figure 3:
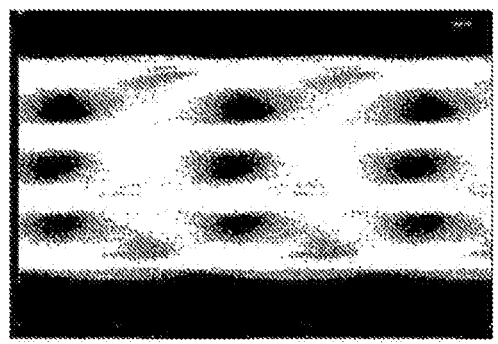

FIG. 3 shows an example of an output signal before and after application of a jitter by the signal processor 100 according to the present embodiment. This figure shows an eye diagram of a PAM4 signal with a modulation rate of 26 Gbaud, showing the time in the lateral axis and the voltage in the vertical axis. In addition, the diagram to the left in this figure shows the PAM4 signal before jitter application, and the diagram to the right shows the PAM4 signal after applying a jitter having a frequency of 100 MHz and amplitude of 10 psP-P, by the signal processor 100 according to the present embodiment. As shown in this figure, the PAM4 signal to which jitter has been applied precisely is obtained, even with a high modulation rate of 26 Gbaud.

Thus, when outputting a jitter-applied data signal obtained by re-timing the data signals with the clock signal, the signal processor 100 according to the present embodiment enables the bit transition of the data signals to be less likely to occur within the setup-hold time by means of a jitter, compared to when applying a jitter to one of the data variable delay circuit 120 or the clock variable delay circuit 140, for example, since a jitter signal to change the amount of delay in the same direction is supplied to both of the data variable delay circuit 120 and the clock variable delay circuit 140, and the delayed data signals are re-timed with the clock signal delayed in the same direction as the data signals. In this way, the signal processor 100 according to the present embodiment enables a reduction of symbol errors due to jitter application, and a precise application of jitter. In addition, the signal processor 100 according to the present embodiment can be applied to a circuit in which a plurality of data signals are re-timed with a single clock, since the data variable delay circuit has a plurality of data variable delay blocks and a jitter signal is supplied to each of them. In addition, the signal processor 100 according to the present embodiment outputs a signal encoded based on logical values of the plurality of data signals in at least one line outputting the jitter-applied data signal. At this time, the encoded signal may be a multi-value modulation signal that is subjected to a multi-value modulation based on logical values of the plurality of data signals, for example. Conventionally, when attempting to delay a signal encoded based on logical values of a plurality of data signals, it is difficult to delay the signal, for example, by first decoding the encoded signal and then encoding it again after delaying the decoded signal. However, with the signal processor 100 according to the present embodiment, since the plurality of data signals and the clock signal are delayed in the same direction in a step before encoding the plurality of data signals, it is easier to delay signals compared to conventional techniques, and it can be easily applied to circuits such as a PAM4 encoder, for example. In addition, with the signal processor 100 according to the present embodiment, since the clock signal is delayed within a range that satisfies the setup-hold timing of the delayed data signal, the bit transition of the data signal can be prevented from occurring within the setup-hold time by means of a jitter. In addition, with the signal processor 100 according to the present embodiment, since the data variable delay circuit 120 and the clock variable delay circuit 140 generate a substantially identical amount of delay for the same jitter signal, a skew between the data and the clock is constant, and a more stable jitter can be applied. In addition, with the signal processor 100 according to the present embodiment, since at least one of a sinusoidal jitter, a random jitter, and a bounded uncorrelated jitter is used as the jitter signal, a jitter-applied data signal with a jitter having a representative feature applied thereto can be output as the test signal.

Figure 4:
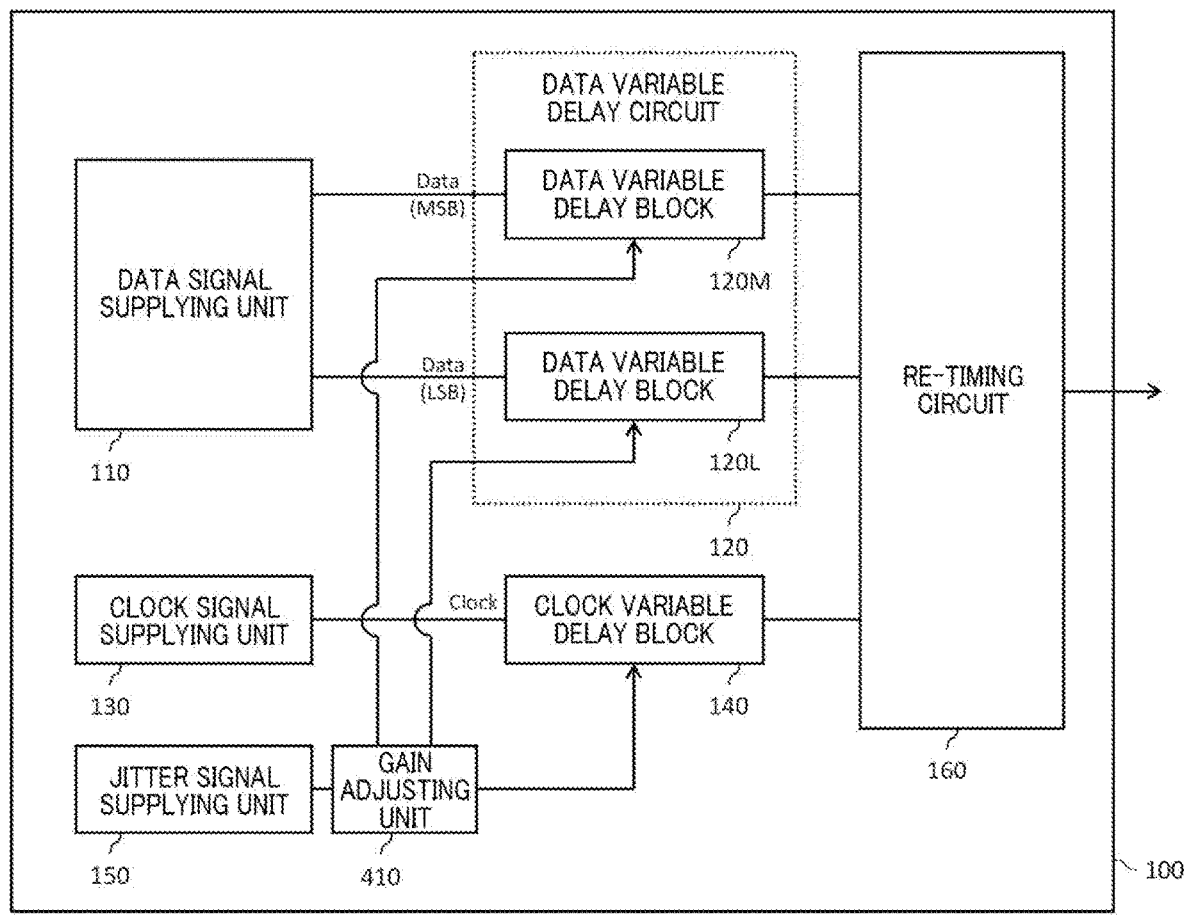
FIG. 4 shows an exemplary block diagram of a signal processor 100 according to another variation of the present embodiment.

FIG. 4 shows an exemplary block diagram of a signal processor 100 according to another variation of the present embodiment. In FIG. 4, components having the same function and configuration as in FIG. 1 are given the same reference numerals, and the following describes only differing points. The signal processor 100 according to the present variation may further include, in addition to the signal processor 100 in FIG. 1, a gain adjusting unit 410 that is capable of adjusting gain of each of the jitter signals supplied from the jitter signal supplying unit 150 to the data variable delay circuit 120 and the clock variable delay circuit 140. As one example, the gain adjusting unit 410 may be a variable attenuator or the like that is capable of adjusting the voltage-delay conversion gain of each jitter signal supplied to the data variable delay circuit 120 and the clock variable delay circuit 140. Note that, although a case in which the gain adjusting unit 410 is an attenuator is shown as one example in the description above, it is not limited thereto, and may be an amplifier or the like that is capable of adjusting the voltage-delay conversion gain of the jitter signal.

The data variable delay circuit 120 and the clock variable delay circuit 140 do not necessarily have an identical configuration, and even when they do, they may be different in sensitivity due to element variations or the like. The gain adjusting unit 410 adjusts such differences in sensitivity by the voltage-delay conversion gain. It then makes adjustments so that the relation between the amount of delay provided to the data signals and the clock signal by the data variable delay circuit 120 and the clock variable delay circuit 140, respectively, satisfies the predetermined relation, when the same jitter signal is supplied to the data variable delay circuit 120 and the clock variable delay circuit 140.

Figure 5:
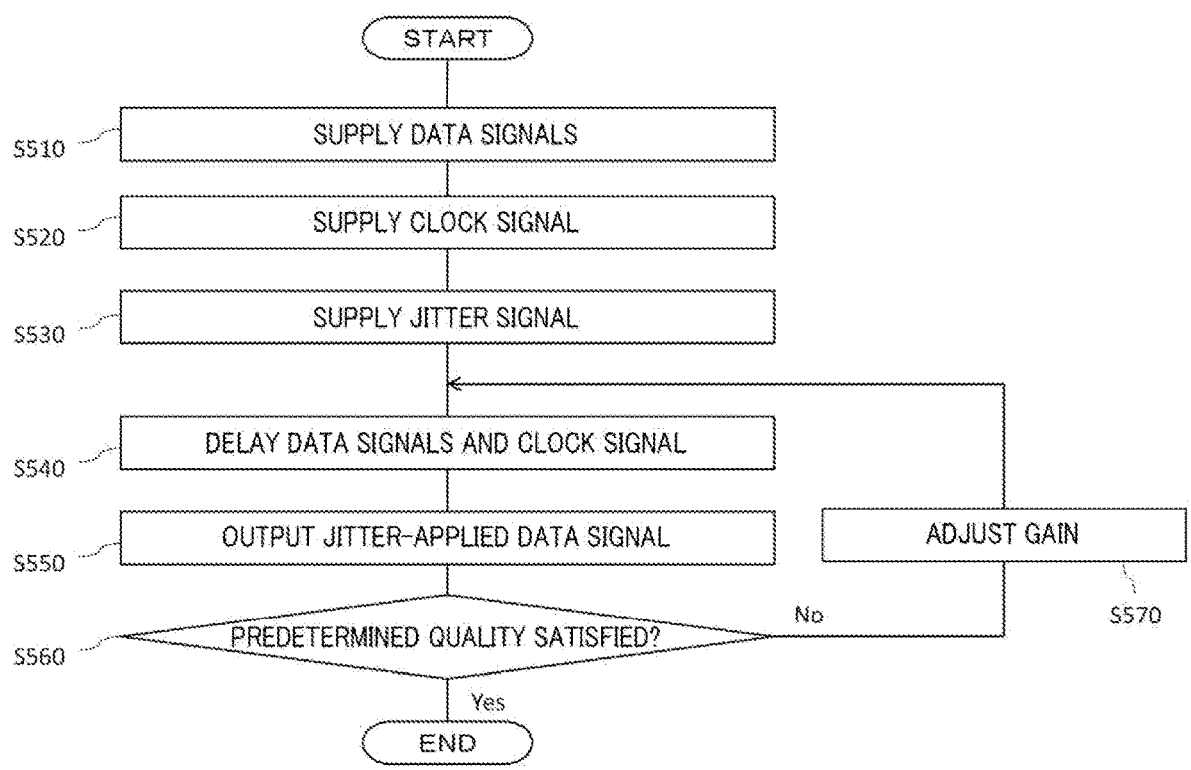
FIG. 5 shows an exemplary procedure of outputting a jitter-applied data signal by the signal processor 100 according to another variation of the present embodiment.

FIG. 5 shows an exemplary procedure of outputting a jitter-applied data signal by the signal processor 100 according to another variation of the present embodiment. Description for steps 510-550 in this figure will be omitted since they are identical to steps 210-250 in FIG. 2. In step 560, the signal processor 100 determines whether the jitter-applied data signal output in step 550 satisfies a predetermined quality. At this time, the signal processor 100 may make said determination based on any criteria. For example, the signal processor 100 may determine that the jitter-applied data signal does not satisfy the predetermined quality, when the symbol error rate of the jitter-applied data signal exceeds a predetermined threshold. In addition, the signal processor 100 may calculate a skew between the data signals delayed by the data variable delay circuit 120 and the clock signal delayed by the clock variable delay circuit 140, and may determine that the jitter-applied data signal does not satisfy the predetermined quality when the skew exceeds a predetermined threshold. In addition, the signal processor 100 may calculate a skew between a plurality of data signals delayed by a plurality of data variable delay blocks 120M and 120L, and may determine that the jitter-applied data signal does not satisfy the predetermined quality, when the skew exceeds a predetermined threshold.

The signal processor 100 proceeds to step 570 when it determined that the jitter-applied data signal does not satisfy the predetermined quality in step 560, and adjusts gain of at least one of the jitter signals to be supplied to the data variable delay circuit and the clock variable delay circuit. The signal processor 100 then returns the process to step 540 and repeats the process until it determines that the jitter-applied data signal satisfies the predetermined quality in step 560.

On the other hand, when the signal processor 100 determines that the jitter-applied data signal satisfies the predetermined quality in step 560, the signal processor 100 ends the process.

In this manner, with the signal processor 100 according to another variation of the present embodiment, the structural differences of the data variable delay circuit 120 and the clock variable delay circuit 140 and differences in sensitivity due to element variation can be adjusted, and the amount of delay to be provided to the data signal and the clock signal can be controlled precisely, since the signal processor 100 further includes a gain adjusting unit 410 that is capable of adjusting gain of each jitter signal supplied from the jitter signal supplying unit 150 to the data variable delay circuit 120 and the clock variable delay circuit 140.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 100 signal processor,
110 data signal supplying unit,
120 data variable delay circuit,
130 clock signal supplying unit,
140 clock variable delay circuit,
150 jitter signal supplying unit,
160 re-timing circuit,
410 gain adjusting unit

What is claimed is:

1. A signal processor comprising:
a first data variable delay block that delays first data signals;
a second data variable delay block that delays second data signals;
a clock variable delay circuit that delays a clock signal indicating timing to acquire the first data signals and the second data signals;
a jitter signal supplying unit that supplies, to the first data variable delay block, the second data variable delay block, and the clock variable delay circuit, a jitter signal to change an amount of delay in a same direction; and
a re-timing circuit that outputs, as a jitter-applied data signal, a multi-level Pulse Amplitude Modulation signal of two or more bits obtained by
re-timing the first data signals delayed by the first data variable delay block and the second data signals delayed by the second data variable delay block with the clock signal delayed by the clock variable delay circuit, and
encoding, by a multi-level Pulse Amplitude Modulation, the retimed first data signals as most significant bits and the retimed second data signals as least significant bits of the multi-level Pulse Amplitude Modulation signal.

2. The signal processor according to claim 1, wherein the clock variable delay circuit delays the clock signal within a range that satisfies setup-hold timing of the first data signals delayed by the first data variable delay block and setup-holding timing of the second data signals delayed by the second data variable delay block.

3. The signal processor according to claim 2, wherein the first data variable delay block, the second data variable delay block, and the clock variable delay circuit generate a substantially identical amount of delay for the same jitter signal.

4. The signal processor according to claim 1, further comprising a gain adjusting unit that is capable of adjusting gain of each of the jitter signals supplied from the jitter signal supplying unit to the first data variable delay block, the second data variable delay block, and the clock variable delay circuit.

5. The signal processor according to claim 1, wherein the jitter signal supplying unit supplies at least one of a sinusoidal jitter, a random jitter, and a bounded uncorrelated jitter, as the jitter signal.

6. A signal processing method comprising:
supplying, to a first data variable delay block that delays first data signals, a second data variable delay block that delays second data signals, and a clock variable delay circuit that delays a clock signal indicating timing to acquire the first data signals and the second data signals, a jitter signal to change an amount of delay in a same direction, and
outputting, as a jitter-applied data signal, a multi-level Pulse Amplitude Modulation signal of two or more bits obtained by
re-timing the first data signals delayed by the first data variable delay block and the second data signals delayed by the second data variable delay block with the clock signal delayed by the clock variable delay circuit, and
encoding, by a multi-level Pulse Amplitude Modulation, the retimed first data signals as most significant bits and the retimed second data signals as least significant bits of the multi-level Pulse Amplitude Modulation signal.

* * * * *